United States Patent
Okamura

(10) Patent No.: US 6,376,367 B1
(45) Date of Patent: Apr. 23, 2002

(54) METHOD FOR MANUFACTURING MULTILAYER INTERCONNECTS BY FORMING A TRENCH WITH AN UNDERLYING THROUGH-HOLE IN A LOW DIELECTRIC CONSTANT INSULATOR LAYER

(75) Inventor: Hiroshi Okamura, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/522,047

(22) Filed: Mar. 9, 2000

(30) Foreign Application Priority Data

Mar. 12, 1999 (JP) .......................................... 11-067225

(51) Int. Cl.$^7$ ......................................... H01L 21/4763
(52) U.S. Cl. ........................ 438/638; 438/637; 438/633
(58) Field of Search ................................ 438/637, 631, 438/633, 634, 622, 623

(56) References Cited

U.S. PATENT DOCUMENTS

| | | |
|---|---|---|
| 5,635,423 A | 6/1997 | Huang et al. |
| 5,877,076 A | 3/1999 | Dai |
| 6,010,955 A | 1/2000 | Hashimoto |
| 6,017,817 A * | 1/2000 | Chung et al. |
| 6,066,569 A * | 5/2000 | Tobben |
| 6,156,643 A * | 12/2000 | Chan et al. |
| 6,211,061 B1 * | 4/2001 | Chen et al. |

FOREIGN PATENT DOCUMENTS

| | | |
|---|---|---|
| JP | 55-91827 | 7/1980 |
| JP | 8-17918 | 1/1996 |

* cited by examiner

*Primary Examiner*—Charles Bowers
*Assistant Examiner*—Stephen W. Smoot
(74) *Attorney, Agent, or Firm*—Mark P. Watson

(57) ABSTRACT

A semiconductor device having good electrical properties, and a method of manufacturing this semiconductor device by forming an insulation layer on a first wiring layer and then, in this insulation layer, simultaneously forming a second wiring layer and a contact layer for connecting the first wiring layer and the second wiring layer. A first mask having an opening over a wiring trench in which the second wiring layer will be formed is formed on the insulation layer. A second mask having an opening for a through-hole where the contact layer is to be formed is then formed over the insulation layer and first mask. The insulation layer is then etched using the second mask as a mask. Then the insulation layer is again etched using the first mask as a mask to form wiring trench and through-hole. The wiring trench and through-hole are then filled with a conductive material to form the second wiring layer and contact layer.

10 Claims, 5 Drawing Sheets

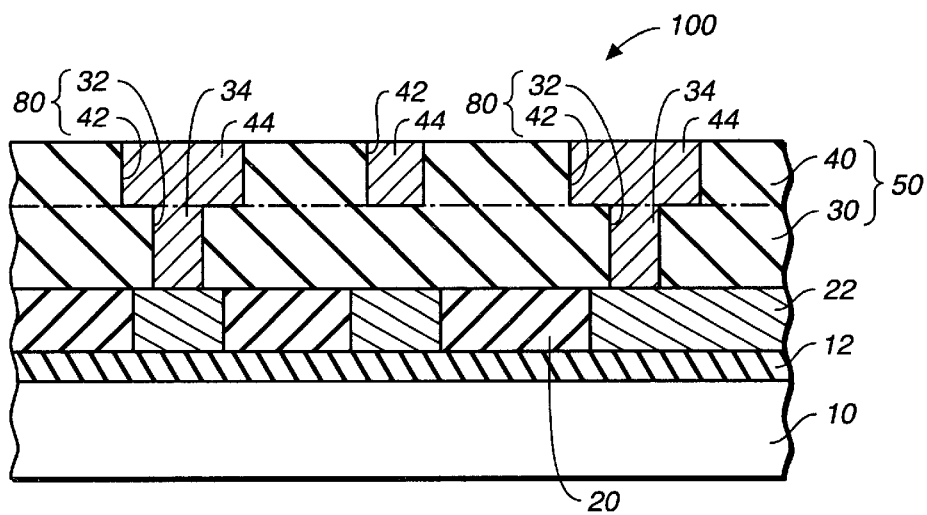
FIG._1
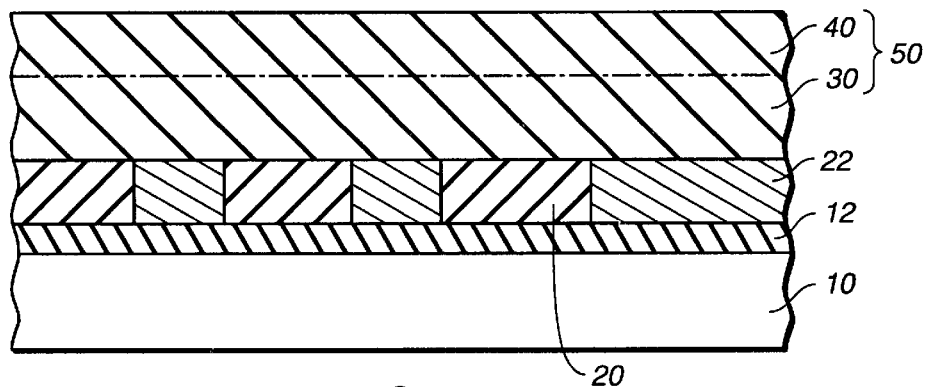
FIG._2
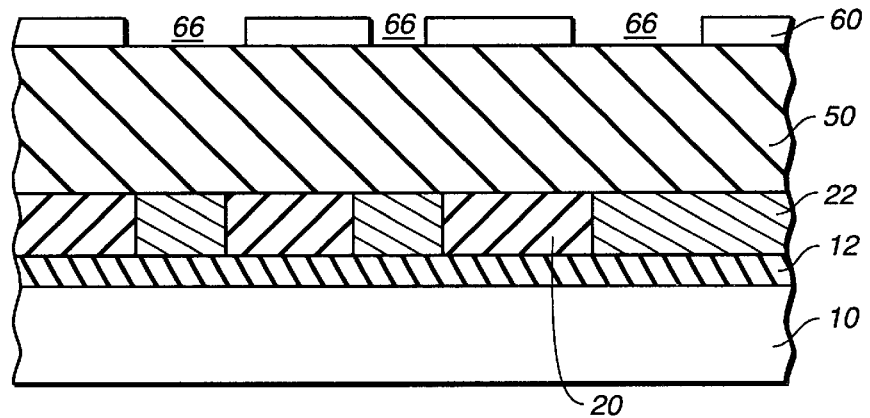
FIG._3

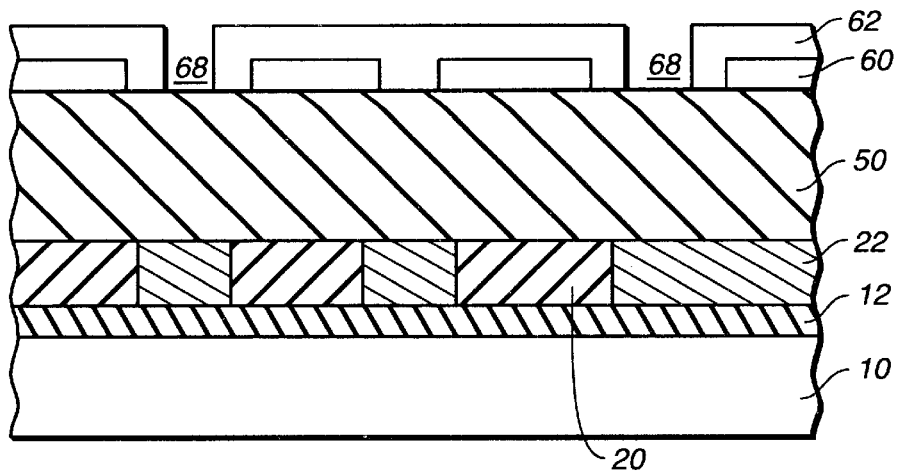
FIG._4
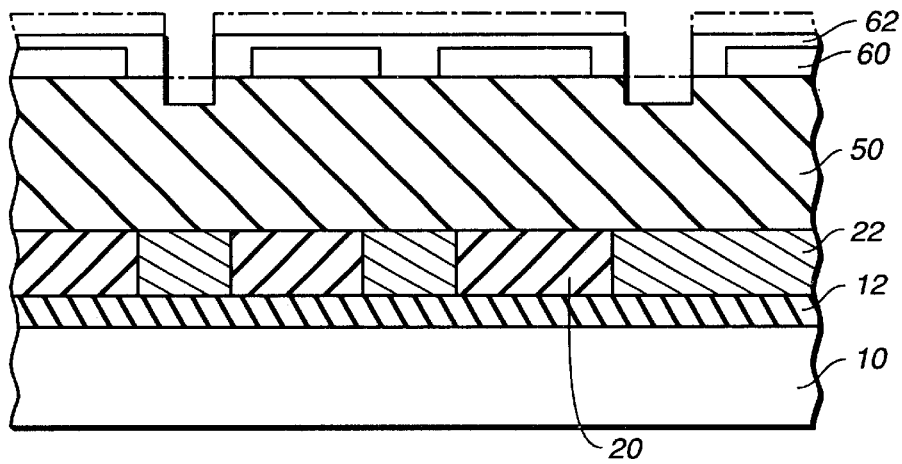
FIG._5
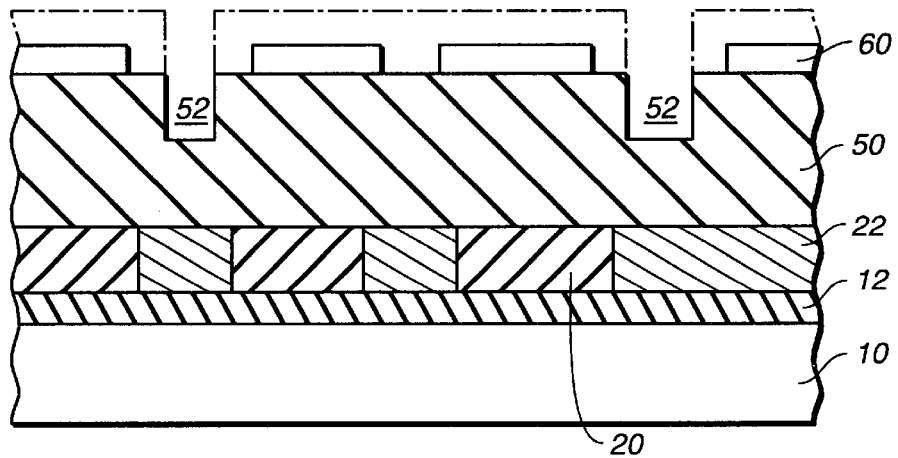
FIG._6

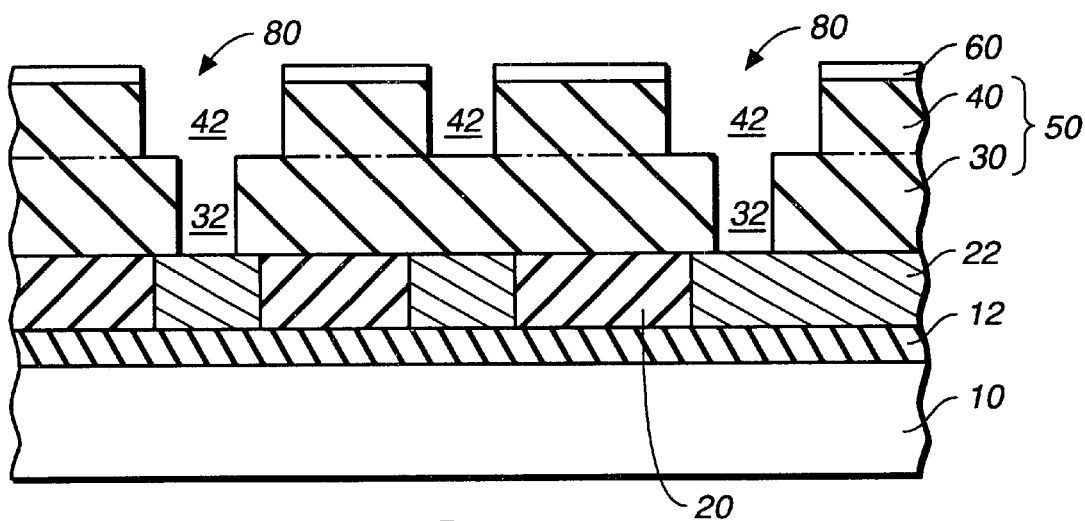
FIG._7
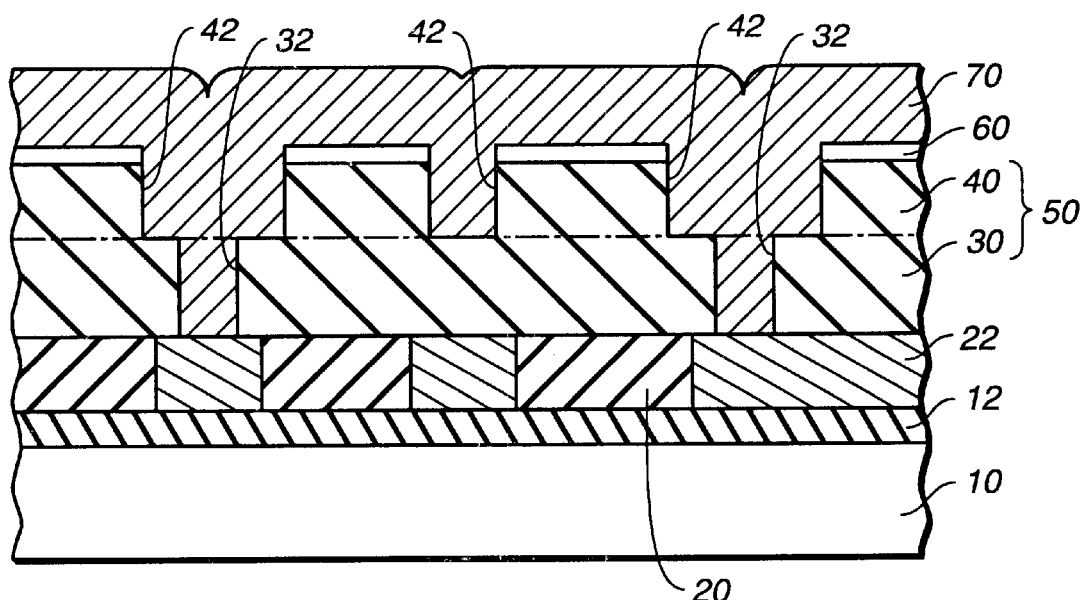
FIG._8

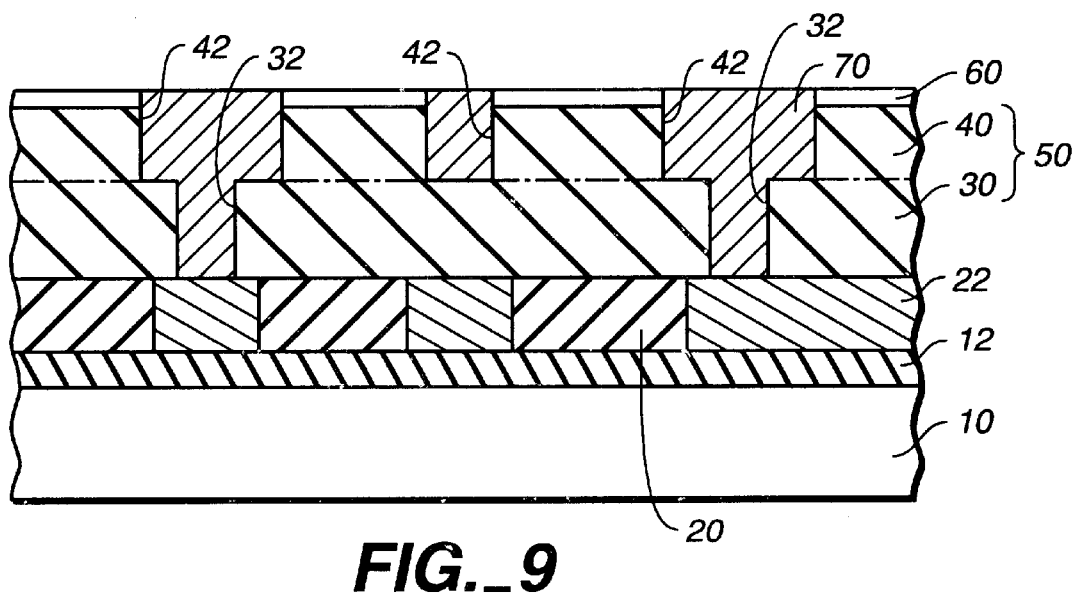
FIG._9
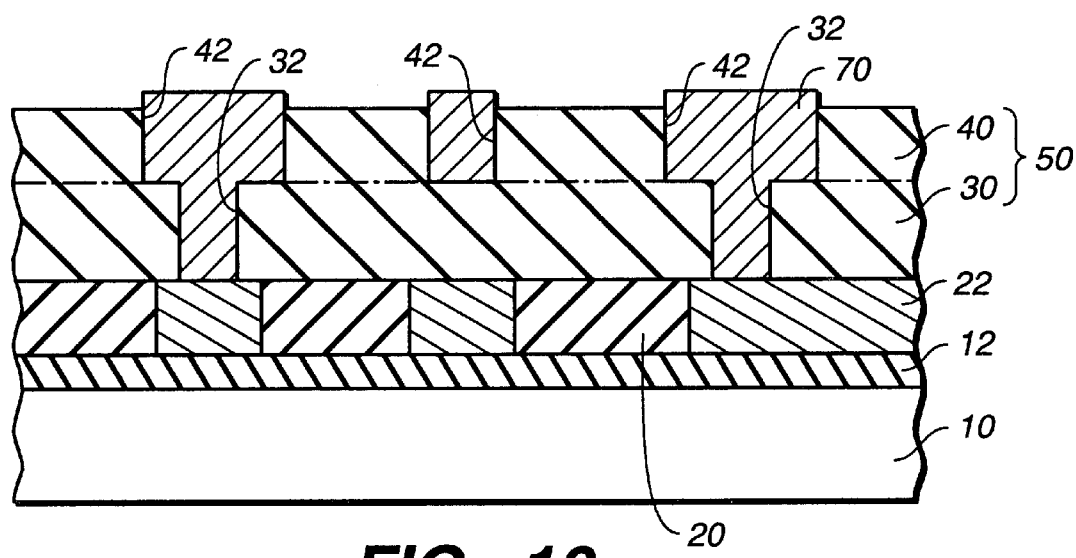
FIG._10

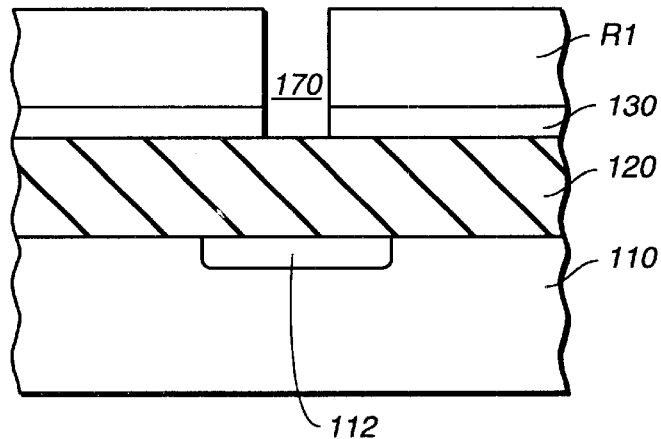
FIG._11
(PRIOR ART)
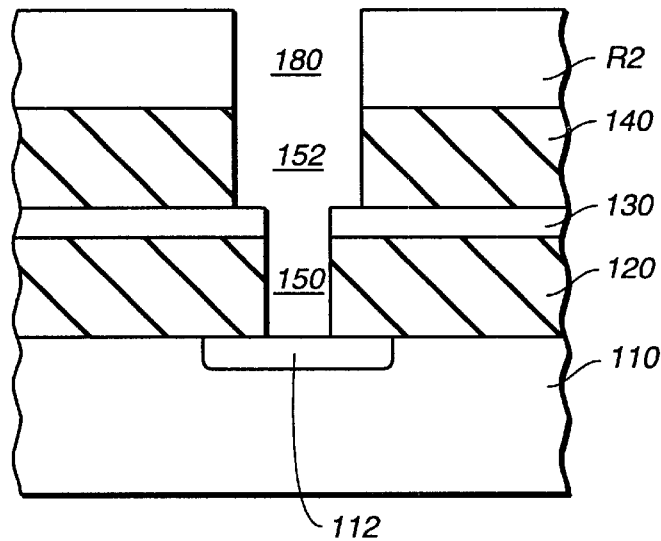
FIG._12
(PRIOR ART)
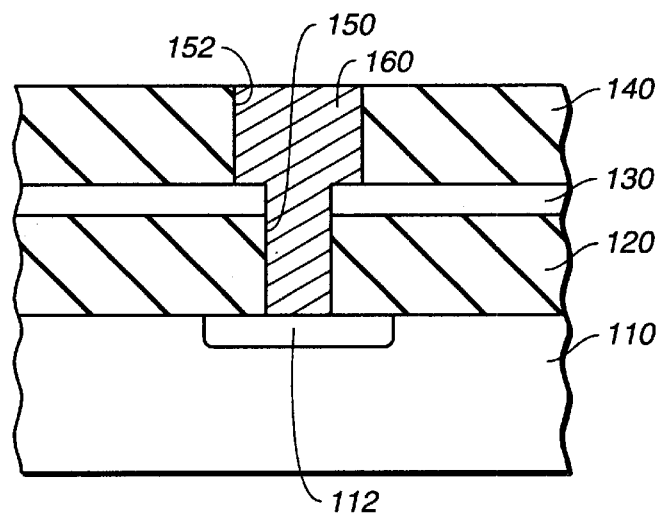
FIG._13
(PRIOR ART)

METHOD FOR MANUFACTURING MULTILAYER INTERCONNECTS BY FORMING A TRENCH WITH AN UNDERLYING THROUGH-HOLE IN A LOW DIELECTRIC CONSTANT INSULATOR LAYER

BACKGROUND OF THE INVENTION

1. Field of the Invention

The present invention relates to a manufacturing method for a semiconductor device, and relates more particularly to a manufacturing method for a semiconductor device having a multilayer interconnect.

2. Description of the Related Art

With the progress in miniaturization and integration of semiconductor devices, the number of interconnect layers has steadily increased. This has resulted in the number of processes required to form the wiring layers and the contact layers for electrically interconnecting the wiring layers accounting for a larger percentage of the total number of manufacturing processes needed for semiconductor device manufacture. The method of forming the wiring layers and contact layers thus occupies an extremely important position in the overall semiconductor device manufacturing process.

One technique for easily and simultaneously forming wiring and contact layers is the dual damascene method. The technique that is taught in Japanese Unexamined Patent Application (kokai) 8-17918 is described below as an example of this dual damascene method.

Typical steps in the production of a wiring layer and contact layer using this dual damascene method are shown in FIG. 11 to FIG. 13.

Referring first to FIG. 11, a first insulation layer 120 is formed on a silicon substrate 110 in which a diffusion layer 112 is formed. A silicon nitride layer 130 is then formed over the first insulation layer 120, and a resist layer R1 is formed over the silicon nitride layer 130. There is an opening 170 in the resist layer R1 above a spot where a contact hole 150, further described below, is to be formed. The silicon nitride layer 130 is then etched.

Referring next to FIG. 12, after the resist layer R1 is removed, a second insulation layer 140 is formed over the silicon nitride layer 130 and first insulation layer 120. Another resist layer R2 is then formed on this second insulation layer 140. There is an opening 180 in this resist layer R2 positioned at the area where a trench 152, further described below, is to be formed. The second insulation layer 140 is then etched using the resist layer R2 as a mask to form a trench 152, and the first insulation layer 120 is etched using the silicon nitride layer 130 as a mask to form a contact hole 150.

After first removing the resist layer R2, the contact hole 150 and trench 152 are then filled with a conductive material so as to cover all surfaces thereof. See FIG. 13. The surface is then polished using a chemical-mechanical polishing (CMP) technique to form an embedded wiring layer 160.

It will be appreciated from the above description that a silicon nitride layer 130, which functions as a mask for etching the first insulation layer 120, must be disposed between the first insulation layer 120 and second insulation layer 140 in order to form contact hole 150 and trench 152 with the above method. When a silicon nitride layer 130 is disposed between the first insulation layer 120 and second insulation layer 140, a resistance-capacitance (RC) line delay occurs as a result of the high dielectric constant of the silicon nitride layer 130. That is, a delay in signal transmission occurs because of an increase in line resistance and an increase in line capacitance. The presence of an RC line delay leads to various problems, including a drop in the processing capacity (e.g., speed) of the semiconductor device, operational errors resulting from cross-talk, and an increase in temperature (heat output) in conjunction with an increase in power consumption.

OBJECTS OF THE INVENTION

Therefore, it is an object of the present invention to overcome the aforementioned problems.

A more particular object of the present invention is to resolve the above noted problems by providing a semiconductor device having good electrical characteristics, and by providing a manufacturing method for such semiconductor device.

SUMMARY OF THE INVENTION

To achieve these objects, the present invention provides a method for manufacturing a semiconductor device having a plurality of wiring layers, and an insulation layer intervening between wiring layers, and comprises the following steps:

(A) forming an insulation layer on a first wiring layer;

(B) forming in a top part of the insulation layer a wiring trench in an area where a second wiring layer will be formed, and forming in a bottom part of the insulation layer a through-hole in an area where a contact layer for electrically connecting the second wiring layer and first wiring layer will be formed; and (C) filling a conductive material into the wiring trench and through-hole to integrally form the second wiring layer in the wiring trench with the contact layer in the through-hole.

Step (B) in this method includes the following steps:

(a) forming on the insulation layer a first mask layer having an opening located above an area where the wiring trench is to be formed; and (b) forming a second mask layer over the first mask layer and insulation layer. This second mask layer has an opening above an area where the through-hole is to be formed. Also, the etching rate of the second mask layer is different from the etching rate of the first mask layer.

(c) etching the insulation layer using the second mask layer as an etching mask; and (d) etching the insulation layer using the first mask layer as an etching mask.

This semiconductor device manufacturing method of the present invention can thus form a wiring trench and through-hole without disposing a silicon nitride layer between insulation layers. More specifically, by etching the insulation layer using the second mask layer as the mask for etching, a trench patterned identically to the through-hole is formed in the upper part of the insulation layer. The first mask layer is then used as the mask for further etching the insulation layer while maintaining the same trench shape, thereby automatically forming a through-hole and wiring trench aligned with each other.

By thus forming a wiring trench and through-hole without a silicon nitride layer intervening between insulation layers, the step of forming such a silicon nitride layer can be omitted.

A semiconductor device resulting from this manufacturing method does not have a silicon nitride layer intervening between insulation layers. As a result, the dielectric constant between a first wiring layer and second wiring layer can be held to that resulting only from the insulation layer between wiring layers. The RC wiring delay can therefore be kept to the absolute minimum.

The step (C) above preferably includes polishing and planarizing the conductive material by a chemical-mechanical polishing (CMP) after filling the conductive material into the wiring trench and through-hole to integrally form the second wiring layer and contact layer.

The material used for the first mask layer is not limited to a specific material, but is preferably an inorganic material. When the first mask layer is an inorganic material, the inorganic material is preferably a silicon nitride or a silicon dioxide. By using a silicon nitride or a silicon dioxide as the inorganic material, the first mask layer can be used as a stopping layer when the conductive material is polished using a CMP technique.

Yet further preferably steps (c) and (d) are performed in an uninterrupted sequence.

Yet further preferably step (c) includes removing the second mask layer simultaneously with the insulation layer etching. In other words, the etching process removes both the mask layer and the insulation layer. By removing the second mask layer simultaneously with etching the insulation layer, a separate step for removing the second mask layer can be omitted. It is also possible to control the depth ratio between the through-hole and wiring trench in the insulation layer by controlling, for example, the selection of the material for the second mask layer and insulation layer etching, and the shape of the second mask (particularly the height).

The etching rate of the second mask layer depends upon the desired depth ratio between the through-hole and wiring trench, but is preferably in the range of 1000 Å/min to 8000 Å/min, and even more preferably in the range of 2000 Å/min to 3000 Å/min. The height (film thickness) of the second mask layer is preferably in the range 3000 Å to 9000 Å.

With consideration given to the ease of patterning, the second mask layer is yet further preferably an organic material, such as a photoresist. If the second mask layer is made from an organic material, the etchant used for etching in step (c) above is preferably a mixed gas containing a CF gas. The CF gas is further preferably one or more of the following: $CF_4$, $CHF_3$, $C_2F_6$, $C_4F_8$, and $C_5F_8$. Yet further preferably, the mixed gas containing a CF gas contains at least one of the following: CO, Ar, $O_2$, and $N_2$.

Yet further preferably, the conductive material contains at least aluminum or copper.

A semiconductor device produced by a manufacturing method of the present invention has a plurality of wiring layers and an insulation layer present between the wiring layers, and comprises a trench in at least one insulation layer. This trench is stepped, and has a wiring trench formed in a top part of the insulation layer, and a through-hole in a bottom part of the insulation layer so as to expose a surface part of a first wiring layer. A second wiring layer is further formed in the wiring trench, and a contact layer is formed in the through-hole, by filling the trench and through-hole with a conductive material.

The angle formed by the bottom of the wiring trench and the side wall of the through-hole at the stepped part of the trench is substantially a right angle.

It should be noted that the first wiring layer in a semiconductor device according to this invention includes a first, second, or subsequent wiring layer, or a conductive part of a semiconductor element such as a gate electrode or diffusion layer formed on a substrate surface.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings wherein like reference symbols refer to like parts.

FIG. 1 is a section view of a semiconductor device according to a preferred embodiment of the present invention;

FIG. 2 to FIG. 10 are section views illustrating various steps in a manufacturing method for a semiconductor device according to the present invention;

FIG. 11 to FIG. 13 are section views illustrating various steps in a typical manufacturing method for a semiconductor device according to the related art.

DESCRIPTION OF THE PREFERRED EMBODIMENTS

A preferred embodiment of the present invention is described below with reference to the accompanying figures.

1. Device structure

A semiconductor device 100 according to a preferred embodiment of the present invention is described below with reference to FIG. 1, which is a section view of the semiconductor device 100.

In semiconductor elements such as MOSFETs, a wiring layer, and element isolation areas (not shown in the figure) are formed on the surface of substrate 10 of a semiconductor device 100 according to this preferred embodiment. A first interlayer insulation layer 12 is formed on substrate 10. A contact layer (not shown in the figure) for connecting a first wiring layer 20 with a semiconductor element or wiring layer formed on the surface of substrate 10 is formed in this first interlayer insulation layer 12.

First wiring layer 20 and a first wiring insulation layer 22 are formed on top of the first interlayer insulation layer 12. This first wiring insulation layer 22 is formed to provide separations in the first wiring layer 20. Note that the first wiring layer 20 and first wiring insulation layer 22 are formed so that the top surfaces thereof are substantially flush, that is, the layers are formed with the same thickness.

A second interlayer insulation layer 30 is formed on first wiring layer 20 and first wiring insulation layer 22. A through-hole 32 is formed at a specific position in the second interlayer insulation layer 30.

A second wiring insulation layer 40 is formed on the second interlayer insulation layer 30. A wiring trench 42 is formed at a specific location in the second wiring insulation layer 40. Note that the second interlayer insulation layer 30 and second wiring insulation layer 40 are integrally formed.

The through-hole 32 and wiring trench 42 are connected and positioned relative to each other to form a stepped trench 80. The through-hole 32 and wiring trench 42 are then filled with a conductive material, thus integrally forming a contact layer 34 in through-hole 32 with a second wiring layer 44 in wiring trench 42. The top of the second wiring layer 44 and the top of the second wiring insulation layer 40 are substantially flush, that is, the layers are formed with the same thickness.

2. Manufacturing process

A method of manufacturing a semiconductor device 100 according to this preferred embodiment of the invention is described next below. FIG. 2 to FIG. 10 are section views of the semiconductor device 100 at typical steps during its manufacture according to the method of the present invention.

Referring first to FIG. 2, in semiconductor elements such as MOSFETs, a wiring layer, and element isolation areas (not shown in the figure) are formed on the surface of substrate 10. A through-hole and contact layer (not shown in the figure) are then formed in first interlayer insulation layer 12. The first wiring insulation layer 22 and first wiring layer 20 are then formed, and are planarized and polished, as may be required, using a CMP technique so that the top of first wiring layer 20 and the top of first wiring insulation layer 22 are at the same height relative to the substrate 10.

As shown in FIG. 2, a second interlayer insulation layer 30, in which through-hole 32 is formed, and a second wiring insulation layer 40, in which wiring trench 42 is formed, are integrally formed in an uninterrupted sequence on first wiring layer 20 and first wiring insulation layer 22. It should be noted that second interlayer insulation layer 30 and second wiring insulation layer 40 are collectively referred to below as insulation layer 50.

Insulation layer 50 is preferably silicon dioxide, fluorine doped silicon dioxide, or other low dielectric constant inorganic or organic material with a dielectric constant of 3 or less. Exemplary inorganic materials with a low dielectric constant include porous silicon. Exemplary organic materials with a low dielectric constant include organic polymers. Exemplary methods for forming this insulation layer 50 include high density plasma enhanced CVD, thermal CVD, plasma CVD, atmospheric pressure CVD, spin coating and other coating methods, sputtering, and thermal vapor deposition. The thickness of the accumulated insulation layer 50 will depend upon the device specifications, but is typically 200 nm to 2000 nm.

Referring next to FIG. 3, a first mask 60 is formed on the insulation layer 50. The material from which this first mask 60 is formed is not limited to any specific material, but is typically an organic or inorganic material such as silicon nitride, silicon dioxide, silicon oxynitride, or polysilicon. Particularly preferable materials for first mask 60 are materials that can function as a stopping layer during polishing conductive layer 70, further described below with reference to FIG. 8, with a CMP technique. Exemplary materials include, for example, silicon nitride, silicon dioxide, and silicon oxynitride. CVD is one exemplary method for forming first mask 60.

The first mask 60 is then coated with a photoresist, and the photoresist (not shown in the figure) is patterned by photolithography. Note that there is an opening in this photoresist above the area where wiring trench 42 is to be formed. The first mask 60 is then etched and patterned using the photoresist as a mask. As shown in FIG. 3, this etching step forms opening 66 in the first mask 60 above where wiring trench 42 is to be formed.

Referring next to FIG. 4, a second mask 62 is formed over first mask 60 and insulation layer 50. This second mask 62 can be made from any material that will be gradually removed simultaneously with etching of insulation layer 50. With consideration given to the ease of patterning, the second mask 62 is preferably an organic material such as a positive or negative photoresist if the first mask 60 is made from silicon nitride.

The second mask 62 is formed and patterned to form an opening 68 above the area where through-hole 32 is to be formed. If the second mask 62 is a photoresist as noted above, this photoresist is coated over the insulation layer 50 and first mask 60 and then patterned by photolithography. If the second mask 62 is not a photoresist, a photoresist is coated over the second mask 62, the resist is patterned by photolithography, and the second mask 62 is then etched using this resist as a mask to pattern the second mask 62.

Referring next to FIG. 5, the insulation layer 50 and second mask 62 are etched while also using the second mask 62 as a mask for the insulation layer 50. This etching step forms through-hole 52 in the top of insulation layer 50. It should be noted that this etching step using the second mask 62 as a mask for insulation layer 50 is referred to below as the first etching step.

A dry etching technique, or even more preferably a high density plasma etching technique, is preferably used for this first etching step. Using a dry etching technique enables the etching rate of the insulation layer 50 to be controlled independently of the etching rate of the second mask 62 by adjusting the etching conditions (e.g., the etchant, plasma density, pressure, and temperature), and makes it possible to accomplish this first etching step and a second etching step further described below in the same etching chamber.

The etchant used for this etching step shall not be limited as long as it enables the insulation layer 50 and the resist layer (second mask 62) to be etched simultaneously. If the second mask 62 is a photoresist or other organic material, and the insulation layer 50 is silicon dioxide, an exemplary etchant is a mixed gas containing a fluorocarbon (CF) gas. Furthermore, this CF gas is preferably one or more of the following: $CF_4$, $CHF_3$, $C_2F_6$, $C_4F_8$, and $C_5F_8$. The mixed gas containing a CF gas further preferably contains one or more of the following: CO, Ar, $O_2$, and $N_2$.

The etching rate of the second mask 62 is determined by the desired depth ratio between the through-hole 32 and wiring trench 42, but is preferably in the range of 1000 Å/min to 8000 Å/min, and even more preferably in the range of 2000 Å/min to 3000 Å/min.

The height (film thickness) of the second mask 62 is preferably in the range 3000 Å to 9000 Å.

If any of the second mask 62 remains after this first etching step, it can be removed as required by switching to plasma etching using oxygen only. In addition, removing any remaining second mask 62 can be accomplished in the same chamber used for the first etching step.

After the second mask 62 has been removed as shown in FIG. 6, the insulation layer 50 is etched using the first mask 60 layer as the etching mask as shown in FIG. 7. The insulation layer 50 is etched in this step while maintaining the shape of the through-hole 52. After this etching step is completed, a through-hole 32 is formed in the second interlayer insulation layer 30, and wiring trench 42 is formed in the second wiring insulation layer 40, with the through-hole 32 and wiring trench 42 automatically aligned with each other. This etching step using the first mask 60 layer as the etching mask is referred to below as the second etching step.

The same etching techniques used for the first etching step can be used in this second etching step. Further preferably, the same technique is used for both the first and second etching steps. By using the same technique for both the first and second etching steps, the second etching step can be performed following the first etching step in an uninterrupted sequence. The etchant used for this second etching step is also not limited to a specific type, and can be the same etchant used for the first etching step. The etching rate for the second mask 62 is different (higher) than the etching rate for the first mask 60 due to the selection of materials for the first and second masks.

Referring next to FIG. 8, a conductive layer 70 is formed over the insulation layer 50 so as to fill the through-hole 32 and wiring trench 42. This conductive layer 70 can be a single primary layer comprising a material selected from the group consisting of an Al alloy, a Cu alloy, a pure copper, or a tungsten, or the conductive layer 70 can be a multilayer structure having a barrier layer or a wetting layer below the above described primary wiring layer.

A typical multilayer structure in which the Al alloy layer is the primary wiring layer could be Ti/TiN/Al—Cu, Ti/Al—Cu, Ta/TaN/Al—Cu, or Nb/Al—Cu. If the wiring layer is primarily Cu, typical multilayer structures include Ti/TiN/Cu, Ta/TaN/Cu, and WN/Cu.

Exemplary methods for forming this conductive layer 70 include CVD, plating methods, sputtering, vapor deposition, and coating methods.

The conductive layer 70 is then polished and planarized, as shown in FIG. 9. If the first mask 60 is a material that can function to stop the polishing process, the first mask 60 can be used as a stopping layer. Exemplary methods for polishing the conductive layer 70 include CMP, dry etch back, and wet removal. The first mask 60 is then removed, as shown in FIG. 10.

Any part of conductive layer 70 protruding above the level of the top of the second wiring insulation layer 40 is then removed as required so that the top of the second wiring insulation layer 40 and the top of the conductive layer 70 are at substantially the same height relative to the substrate 10. This protruding part of the conductive layer 70 can be removed by such methods as CMP, dry etching, and wet removal.

As a result of the above-described process, a semiconductor device 100 according to this preferred embodiment of the present invention is achieved with a contact layer 34 formed in through-hole 32, and second wiring layer 44 formed in wiring trench 42, as shown in FIG. 1.

It will be evident from the preceding description of this preferred embodiment that through-hole 32 and wiring trench 42 are formed simultaneously by the first etching step using first mask 60 as an etching mask and the second etching step using the second mask 62 as an etching mask. The following benefits are achieved by thus forming through-hole 32 and wiring trench 42.

That is, through-hole 32 and wiring trench 42 can be simultaneously formed without a silicon nitride layer intervening between the second interlayer insulation layer 30 and second wiring insulation layer 40. It is therefore possible to eliminate the step of disposing an intervening silicon nitride layer.

A semiconductor device thus manufactured does not have a silicon nitride layer intervening between the second interlayer insulation layer 30 and second wiring insulation layer 40. As a result, the dielectric constant between the first wiring layer 20 and second wiring layer 44 can be held to that resulting only from the second interlayer insulation layer 30. The RC wiring delay can therefore be kept to the absolute minimum.

In addition, a less rigorous photolithography step can be used for forming the through-hole 32. That is, because the through-hole 32 pattern is part of the pattern of the second mask 62, reduction of the through-hole 32 as a result of alignment error is eliminated, interruptions resulting from an insufficient metal gap-fill margin can be prevented, degraded electromigration can be prevented, and an increase in contact resistance can be prevented. As a result, wiring reliability can be improved.

The manufacturing process can also be simplified by simultaneously forming through-hole 32 and wiring trench 42.

Furthermore, the second mask 62 is removed simultaneously in the first etching step in a manufacturing method according to this preferred embodiment of the invention. As a result, a step of removing the second mask 62 can be eliminated.

Furthermore, because the second mask 62 is simultaneously removed in the first etching step, the depth ratio between the through-hole 32 and wiring trench 42 in the insulation layer 50 can be controlled by controlling, for example, the selection of the second mask 62 material and insulation layer 50 etching, and the shape of the second mask 62 (particularly the height).

It will be obvious to one with ordinary skill in the related art that this preferred embodiment of the invention can be varied in many ways within the scope of the accompanying claims. For example, through-hole 32 and wiring trench 42 are formed simultaneously in the insulation layer 50 formed on first wiring layer 20 in the above embodiment. But, the present invention can be applied to simultaneously form a contact hole and wiring trench in any first, second, or subsequent insulation layer formed on the surface of a substrate having a semiconductor element formed thereon.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the appended claims.

What is claimed is:

1. A manufacturing method for a semiconductor device having a plurality of wiring layers and an insulation layer present between said wiring layers, said manufacturing method comprising:

(A) forming an insulation layer on a first wiring layer;

(B) forming in a top part of said insulation layer a wiring trench in an area where a second wiring layer will be formed, and forming in a bottom part of said insulation layer a through-hole in an area where a contact layer for electrically connecting said second wiring layer and said first wiring layer will be formed; and (C) filling a conductive material into said wiring trench and said through-hole to integrally form said second wiring layer in said wiring trench and said contact layer in said through-hole;

wherein said step (B) comprises (a) forming on said insulation layer a first mask layer having an opening above an area where said wiring trench is to be formed;

(b) forming a second mask layer over said first mask layer and said insulation layer, said second mask layer having an opening above an area where said through-hole is to be formed, and having an etching rate different from an etching rate of said first mask layer;

(c) etching said insulation layer using said second mask layer as an etching mask; and then (d) etching said insulation layer using said first mask layer as an etching mask; and wherein said steps (c) and (d) are performed in an uninterrupted sequence.

2. The semiconductor device manufacturing method as in claim 1, wherein said conductive material comprises at least one of aluminum and copper.

3. The semiconductor device manufacturing method as in claim 1, wherein said step (C) comprises polishing and planarizing said conductive material by chemical-mechanical polishing (CMP) after filling said conductive material into said wiring trench and through-hole to integrally form said second wiring layer and said contact layer.

4. The semiconductor device manufacturing method as in claim 1, wherein said first mask layer comprises an inorganic material.

5. The semiconductor device manufacturing method as in claim 4, wherein said inorganic material is one of silicon nitride and silicon dioxide.

6. The semiconductor device manufacturing method as in claim 1, wherein said step (c) includes removing said second mask layer simultaneously with said insulation layer etching.

7. The semiconductor device manufacturing method as in claim 6, wherein said second mask layer comprises an organic material.

8. The semiconductor device manufacturing method as in claim 7, wherein an etchant used for etching in said step (c) comprises a mixed gas containing a CF gas.

9. The semiconductor device manufacturing method as in claim 8, wherein said CF gas is at least one of $CF_4$, $CHF_3$, $C_2F_6$, $C_4F_8$, and $C_5F_8$.

10. The semiconductor device manufacturing method as in claim 9, wherein said mixed gas containing a CF gas contains at least one of CO, Ar, $O_2$, and $N_2$.

* * * * *